US008480847B2

(12) United States Patent
Amano

(10) Patent No.: US 8,480,847 B2
(45) Date of Patent: Jul. 9, 2013

(54) PROCESSING SYSTEM

(75) Inventor: Yoshifumi Amano, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 515 days.

(21) Appl. No.: 12/309,974

(22) PCT Filed: Jan. 28, 2008

(86) PCT No.: PCT/JP2008/051156
§ 371 (c)(1),
(2), (4) Date: Feb. 5, 2009

(87) PCT Pub. No.: WO2008/093624
PCT Pub. Date: Aug. 7, 2008

(65) Prior Publication Data
US 2010/0000682 A1   Jan. 7, 2010

(30) Foreign Application Priority Data
Feb. 1, 2007   (JP) ................... 2007-022618

(51) Int. Cl.
*H01L 21/306* (2006.01)
(52) U.S. Cl.
USPC .................................. 156/345.29
(58) Field of Classification Search
USPC .................................. 156/345.29
See application file for complete search history.

(56) References Cited

U.S. PATENT DOCUMENTS

| | | | |
|---|---|---|---|
| 6,080,531 A * | 6/2000 | Carter et al. | 134/1.2 |
| 6,517,999 B1 * | 2/2003 | Oya et al. | 134/1.3 |
| 6,982,006 B1 * | 1/2006 | Boyers et al. | 134/3 |
| 2003/0140945 A1 * | 7/2003 | Chono | 134/11 |
| 2007/0128878 A1 | 6/2007 | Izumi et al. | |

FOREIGN PATENT DOCUMENTS

| | | |
|---|---|---|
| JP | 2003-224102 | 8/2003 |
| JP | 2003-332322 | 11/2003 |
| JP | 2006-210420 | 8/2006 |
| JP | 2006210420 * | 8/2006 |
| WO | 2004/079804 A1 | 9/2004 |

OTHER PUBLICATIONS

PCT Notification of Transmittal of Translation of the International Preliminary Examination Report (Form PCT/IB/338) dated Jan. 2004.

(Continued)

*Primary Examiner* — Dah-Wei Yuan
*Assistant Examiner* — Stephen Kitt
(74) *Attorney, Agent, or Firm* — Smith, Gambrell & Russell, LLP

(57) ABSTRACT

A processing system adapted for processing an object to be processed, including a processing vessel configured for containing the object to be processed and for receiving a processing fluid, a processing fluid generating unit configured for generating a processing fluid, a processing-side fluid passage configured for supplying the processing fluid into the processing vessel, and a discharge fluid passage configured for discharging the processing fluid from the processing vessel. The processing system further includes a bypass-side fluid passage configured for discharging the processing fluid generated in the processing fluid generating unit without passing it through the processing vessel, a pressure control mechanism provided to the discharge fluid passage downstream from a position at which the bypass-side fluid passage is connected with the discharge fluid passage, and a switch valve configured to selectively switch a fluid passage of the processing fluid between the processing-side fluid passage and the bypass-side fluid passage.

7 Claims, 4 Drawing Sheets

OTHER PUBLICATIONS

PCT International Preliminary Report on Patentability (Form PCT/IB/373) dated Jan. 2004.

PCT Written Opinion of the International Searching Authority (Form/ISA/237) dated Apr. 2007.

* cited by examiner

PROCESSING SYSTEM

TECHNICAL FIELD

The present invention relates to a processing system adapted for processing an object to be processed, such as a semiconductor wafer, glass used for an LCD substrate or the like.

BACKGROUND ART

Conventionally, in various technical fields, a technique for removing a resist, once coated on a surface of the object to be processed from the surface thereof, has been known. For instance, in a field of manufacturing semiconductor devices, a method of using a processing fluid (or fluids) for peeling off the resist coated on the surface of each semiconductor wafer (hereinafter, referred to as a "wafer") has been known. Specifically, a mixed processing fluid consisting of an ozone gas and water vapor is supplied into a processing vessel in which the wafers are placed, so that the resist coated on each wafer can be oxidized to be water-soluble by the mixed processing fluid. Thereafter, such a resist changed into a water-soluble state is removed by pure water. For instance, a processing system adapted for providing such a process to the object to be processed is disclosed in JP2003-332322A, and is typically composed of an ozone-gas generating unit for generating the ozone gas and a water vapor generating unit for generating the water vapor. In the system disclosed JP2003-332322A, the ozone gas generated in the ozone-gas generating unit and the water vapor generated in the water vapor generating unit are premixed together and then supplied into the processing vessel (e.g., see JP2003-332322A).

In such a processing system, in order to stably and efficiently make the resist water-soluble, it is required to keep the interior of the processing vessel, into which the mixed processing fluid consisting of the ozone gas and stem is supplied, at a predetermined pressure, during this process. Namely, during this operation, it is required to control discharge pressure and discharge flow rate of the mixed processing fluid from the processing vessel, by using a suitable means, for example, a flow-rate variable-control valve or the like.

Meanwhile, in a waiting period or the like, in which the process is not performed, the supply of the processing fluid into the processing vessel is stopped. Typically, during this period, the supply of the ozone gas and water vapor is stopped. Otherwise, the ozone gas and water vapor respectively generated in the ozone-gas generating unit and water vapor generating unit are discharged into the air or another suitable system.

In this conventional system, however, the flow rate of the processing fluid flowing through the flow-rate control valve is greatly changed between the processing period and the waiting period, the flow-rate control by means of the flow-rate control valve tends to be unstable at the beginning of the process, and thus it is impossible to immediately start the process in a relatively stable state.

In the case in which the processing fluid is discharged into the air through a separate system during the waiting period, the flow rate may be considerably changed between the period in which the processing fluid is supplied into the processing vessel and the period in which the processing fluid is discharged into the separate system. Therefore, substantial fluctuation of pressure may tend to be generated in a processing-fluid generating unit. Such fluctuation of pressure may be attributable to considerable change in an amount of the processing fluid generated.

Above all, in the case in which the processing fluid is supplied into a plurality of processing vessels from the processing-fluid generating unit, the fluctuation of pressure in each processing vessel may tend to occur, due to a difference in timing of supplying the processing fluid into each processing vessel or the like cause. Namely, the process performed in one processing vessel may have substantial influence on the process performed in another processing vessel, resulting in an unstable process in each processing vessel.

The present invention was made in light of the above circumstances. Therefore, it is an object of this invention to provide a new processing system adapted for processing the object to be processed, by supplying the processing fluid into the processing vessel, while significantly stabilizing the supply of the processing fluid into the processing vessel.

DISCLOSURE OF INVENTION

The processing system according to the present invention comprises: a processing vessel configured to contain an object to be processed; a processing fluid generating unit configured to generate a processing fluid; a processing-side fluid passage configured for supplying the processing fluid generated in the processing fluid generating unit into the processing vessel; a discharge fluid passage configured for discharging the processing fluid from the processing vessel; a bypass-side fluid passage connected with the discharge fluid passage at its downstream end and configured for discharging the processing fluid generated in the processing fluid generating unit without passing said processing fluid through the processing vessel; a pressure control mechanism provided to the discharge fluid passage downstream from a position at which the downstream end of the bypass-side fluid passage is connected with the discharge fluid passage; and a switch valve configured to selectively switch a fluid passage, into which the processing fluid generated in the processing fluid generating unit is fed, between the processing-side fluid passage and the bypass-side fluid passage.

The processing system according to this invention may further comprise: a purging gas supply fluid passage configured for supplying a purging gas into the processing vessel; and a purging gas discharge fluid passage configured for discharging the purging gas from the processing vessel, wherein a downstream end of the purging gas supply fluid passage may be connected with the processing-side fluid passage downstream from the switch valve, and wherein an upstream end of the purging gas discharge fluid passage may be connected with the discharge fluid passage upstream from the position at which the downstream end of the bypass-side fluid passage is connected with the discharge fluid passage.

In the processing system according to this invention, the switch valve may be configured such that, when the purging gas is supplied into the processing vessel from the purging gas supply fluid passage, the processing fluid generated in the processing fluid generating unit is fed into the bypass-side fluid passage and said processing fluid fed into the bypass-side fluid passage will be discharged from the discharge fluid passage after passing through the pressure control mechanism.

In the processing system according to this invention, the purging gas may be an inert gas.

In the processing system according to this invention, the processing fluid may be an ozone gas.

The processing system according to this invention may further comprises: a second processing fluid generating, unit configured to generate a second processing fluid different from the processing fluid; a second processing-side fluid passage configured for supplying the second processing fluid generated in the second processing fluid generating unit into the processing vessel; a second bypass-side fluid passage configured for discharging the second processing fluid generated in the second processing fluid generating unit without passing said second processing fluid through the processing vessel; and a second switch valve configured to selectively switch a fluid passage, into which the second processing fluid generated in the second processing fluid generating unit is fed, between the second processing-side fluid passage and the second bypass-side fluid passage, wherein a downstream end of the second bypass-side fluid passage may be connected with the discharge fluid passage upstream from the pressure control mechanism.

In the processing system according to this invention, the second processing fluid may be water vapor.

In the processing system according to this invention, the processing vessel may include a plurality of processing vessels, the processing-side fluid passage may include a plurality of processing-side fluid passages, each processing-side fluid passage being provided separately, for each processing vessel, the discharge fluid passage may include a plurality of discharge fluid passages, each discharge fluid passage being provided separately, for each processing vessel, the bypass-side fluid passage may include a plurality of bypass-side fluid passages, each bypass-side fluid passage being provided separately, for each processing vessel, the pressure control mechanism may include a plurality of pressure control mechanisms, each pressure control mechanism being provided individually, for each discharge fluid passage, a downstream end of each bypass-side fluid passage may be connected with each corresponding discharge fluid passage upstream from each corresponding pressure control mechanism, and the processing fluid generated in the processing fluid generating unit may be selectively fed into each corresponding processing-side fluid passage and each corresponding bypass-side fluid passage.

According to the present invention, in either of the case of supplying the processing fluid into the processing vessel or case of feeding the processing fluid into the bypass-side fluid passage without passing processing fluid through the processing vessel, the processing fluid can be flowed at a constant flow rate through the pressure control mechanism provided to the discharge fluid passage. Therefore, the pressure control mechanism can be maintained in a stable state. Even in waiting period in which processing step is not performed, the processing fluid can be generated in the processing fluid generating unit under the same condition as in the processing period. Thus, the generation of the processing fluid can be stabilized, thereby enhancing uniformity of the process performed in the processing vessel. Furthermore, the pressure and flow rate of the processing fluid supplied into each processing vessel can be stabilized. Therefore, even in the case in which the processing fluid is supplied into a plurality of processing vessels from a common processing fluid generating unit, negative interference between the respective processes in the different processing vessels can be avoided, thereby processing each object to be processed under substantially the same condition in the plurality of processing vessels.

MODE FOR CARRYING OUT THE INVENTION

Figure 1:
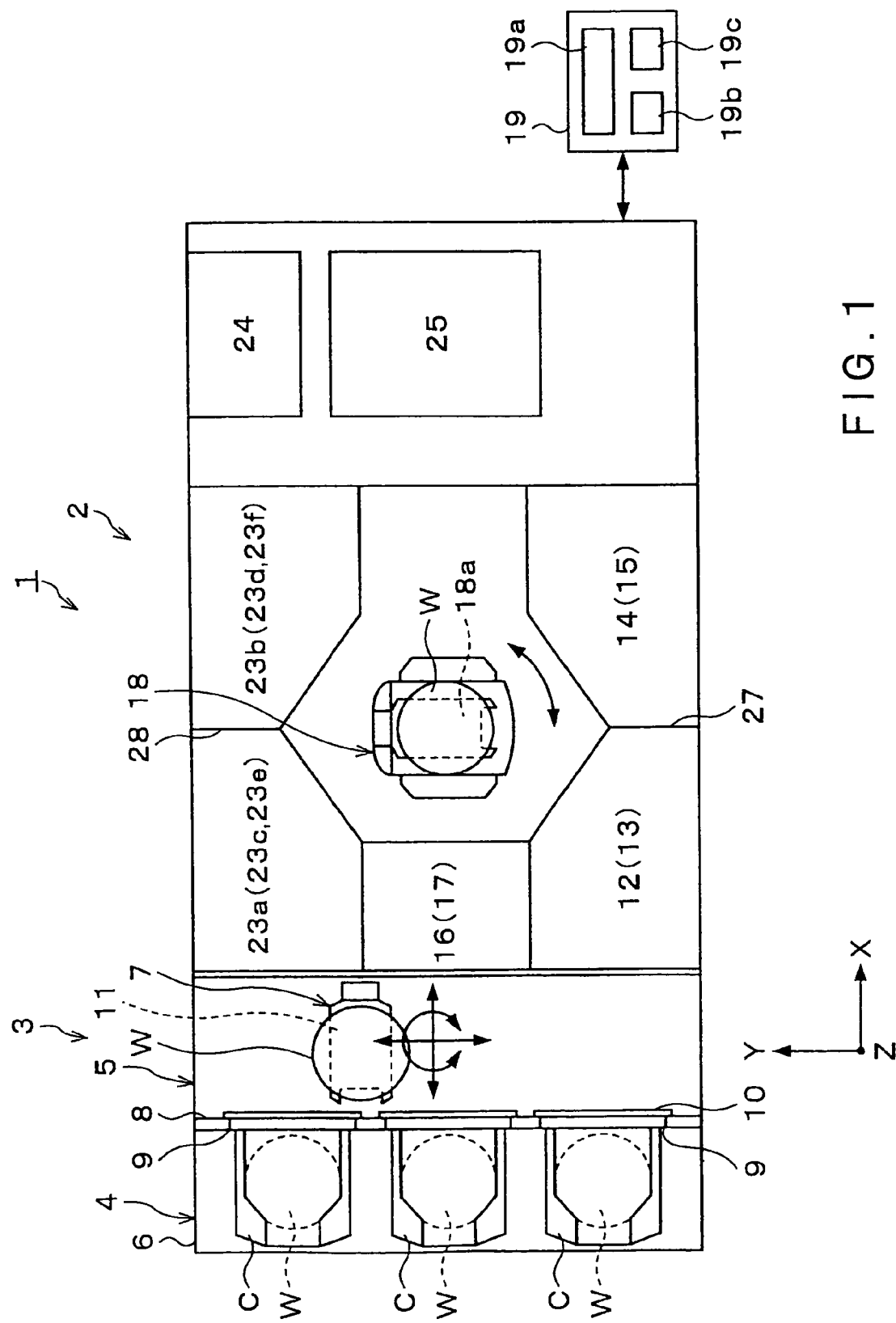
FIG. 1 is a plan view of the processing system related to one embodiment of the present invention.
Figure 2:
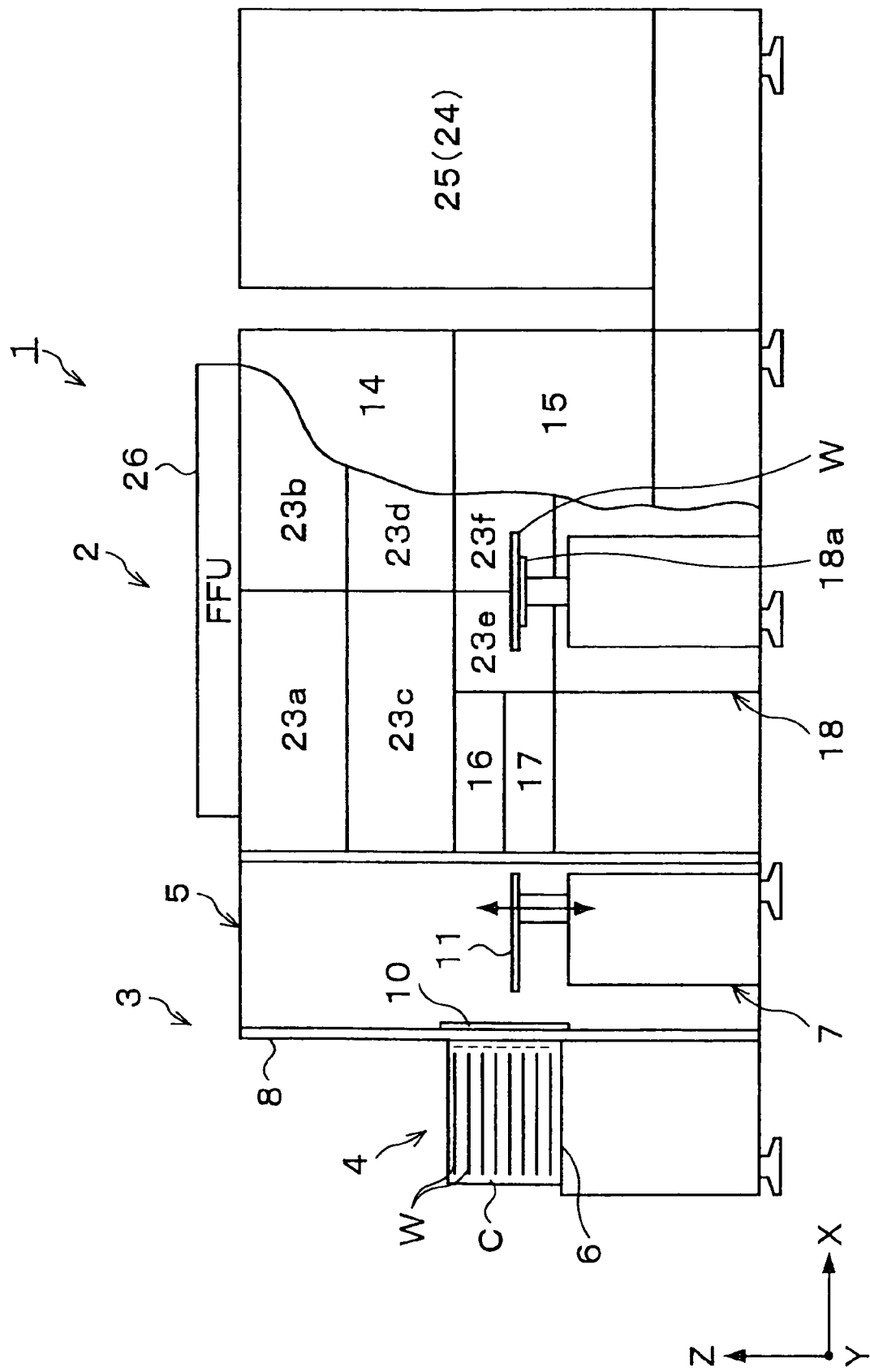
FIG. 2 is a side view of the processing system related to the one embodiment of the present invention.

Hereinafter, one embodiment of the present invention will be described, based on an exemplary processing system 1 adapted for making the resist coated on the surface of each wafer (or semiconductor wafer) W, as one example of the object to be processed, water-soluble so as to peel off the resist from the wafer W. FIG. 1 is a plan view of the processing system 1 related to this embodiment, and FIG. 2 is a side view of the processing system 1. It is noted that like parts having substantially the same function and/or construction will be respectively designated herein by like reference numerals, and that repetition of substantially the same description on such like parts will be respectively omitted.

The processing system 1 includes a processing portion 2 adapted for providing a process for making the resist water-soluble and a cleaning process to the wafer W, a transfer portion 3 adapted for carrying in and carrying out the wafer W relative to the processing portion 2, and a control unit 19 adapted for giving a control command to each component of the processing system 1. For convenience, in FIGS. 1 and 2, a longitudinal direction (or arrangement direction), in which the processing portion 2 and transfer portion 3 are arranged in a horizontal plane, will be referred to as an X direction, while a width direction (or direction orthogonal to the X direction) of the processing portion 2 and transfer portion 3 in the horizontal plane will be referred to as a Y direction, and a vertical direction will be referred to as a Z direction.

Each wafer W having a substantially disk-like shape is carried into the processing system 1 while being stored in a container (carrier C). In this container, multiple sheets (e.g., twenty five sheets) of wafers W can be stored with a predetermined gap, while a surface of each wafer W is arranged in a substantially horizontal direction. The transfer portion 3 includes an in-out port 4 in which a table 6 configured for placing the containers (carriers C) thereon and a wafer carrier portion 5 located between the in-out port 4 and the processing portion 2. In the wafer carrier portion 5, a wafer carrier 7 configured to transfer each wafer W between each container (carrier C) placed on the placing table 6 and the processing portion 2 is provided.

Each wafer W is carried in or carried out through one side face of each carrier C, and therefore a cover that can be optionally opened and closed is provided in this side face of the carrier C. In addition, a shelf plate for holding the wafers W with a predetermined gap is provided to each inner wall of the carrier C. In each shelf plate, twenty five slots, each configured for holding or grasping each wafer W, are formed. Each wafer W is held in each slot, one by one, with one surface of the wafer W (i.e., a face on which a semiconductor device is formed) being a top face (i.e., a face directed to the upper side when the wafer W is horizontally held).

For instance, the table 6 of the in-out port 4 is configured to place three carriers thereon in the Y direction, while each carrier is located in a predetermined position. Each carrier C is placed on the table 6, with the side face thereof, in which the cover is provided, facing a boundary wall 8 between the in-out port 4 and the wafer carrier portion 5. In the boundary wall 8, a window 9 is formed in a position corresponding to each carrier C placed on the table 6. Additionally, a window opening and closing mechanism 10, configured to optionally open and close the window 9, by using a shutter or the like means, is attached to the boundary wall 8 on the side of the wafer carrier portion 5.

The window opening and closing mechanism 10 may also be configured to open and close the cover provided in each carrier C, such that said window opening and closing mechanism 10 can open and close the cover of the carrier C at the same time as opening and closing of the window 9. When the window 9 is opened and a wafer transfer opening of the carrier C is communicated with the wafer carrier portion 5, the wafer carrier 7 provided in the wafer carrier portion 5 becomes accessible to the carrier C, thus making it possible to carry out or carry in each wafer W relative to the carrier C.

The wafer carrier 7 provided in the wafer transfer portion 5 can be moved both in the Y and Z directions, as well as can be rotated about a central axis thereof extending in the Z direction. The wafer carrier 7 has a take-out-and-storage arm 11 configured to grasp each wafer W. This take-out-and-storage arm 11 is configured to be slidably moved in the X direction. In this way, the wafer carrier 7 can access each slot at any given level of each carrier C placed on the table 6. Additionally, the wafer carrier 7 can also access two, upper and lower, wafer transfer units 16, 17 provided in the processing portion 2, respectively. As such, the wafer carrier 7 can carry each wafer W from the in-out port 4 to the processing portion 2 or from the processing portion 2 to the in-out port 4.

The processing portion 2 includes a main wafer carrier (or wafer carrier means) 18, two wafer transfer units 16, 17, four cleaning units 12, 13, 14, 15 and six processing units 23a to 23f. Each of the processing units 23a to 23f is configured to make the resist water-soluble.

Figure 3:
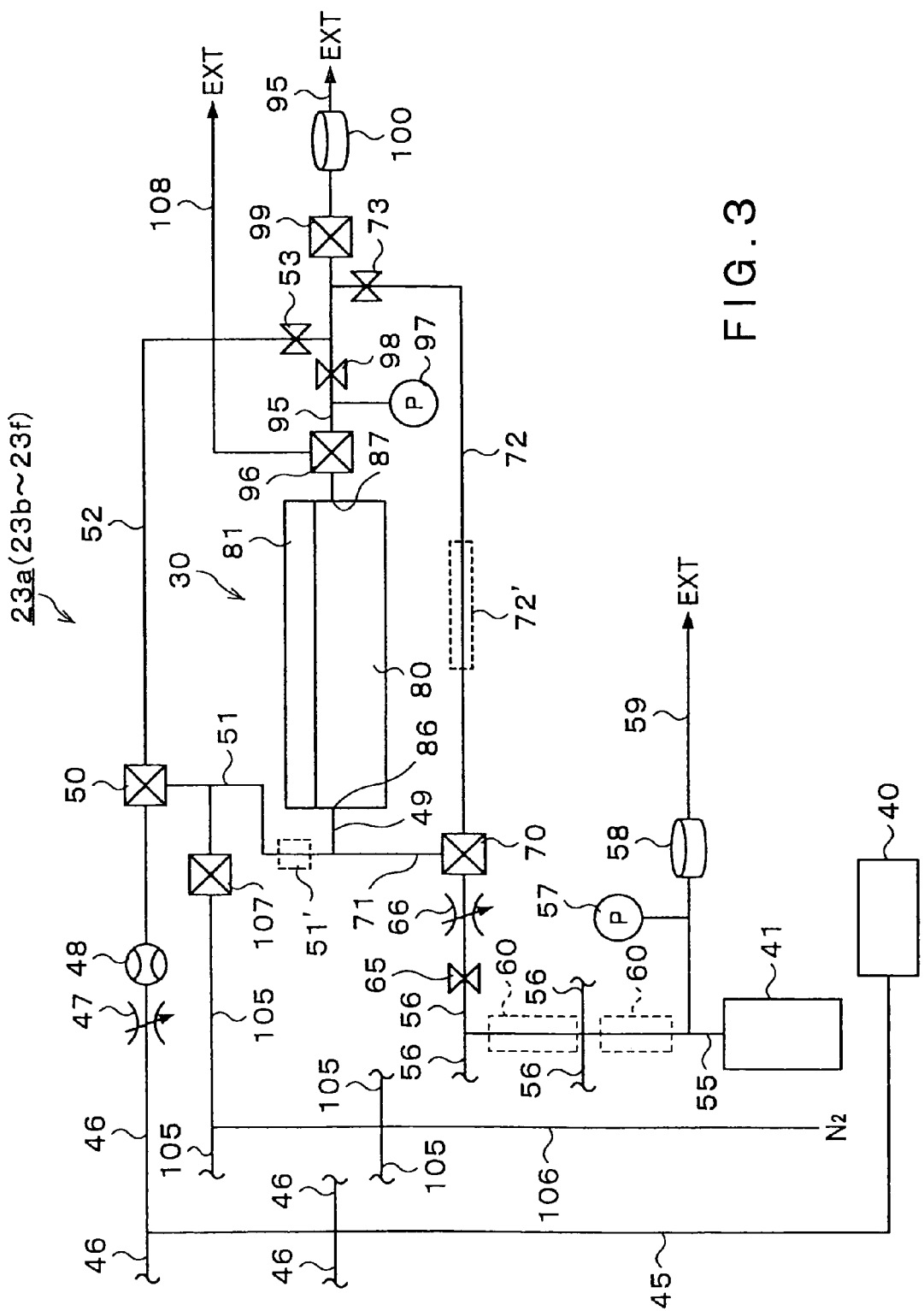
FIG. 3 is a diagram schematically showing construction of one processing unit incorporated into the processing system shown in FIGS. 1 and 2.

In addition, a processing fluid generating unit 24 configured to generate each processing fluid supplied to each processing unit 23a to 23f, and a chemical liquid storage unit 25 configured to store therein a predetermined processing liquid supplied to each cleaning unit 12, 13, 14, 15 are provided in the processing portion 2. As shown in FIG. 3, the processing fluid generating unit 24 includes an ozone gas generating unit (or first processing fluid generating unit) 40 configured to generate an ozone gas used as a first processing fluid and a water vapor generating unit (or second processing fluid generating unit) 41 configured to generate water vapor used as a second processing fluid. In a ceiling of the processing portion 2, a fan filter unit (FFU) 26 is provided for making down-flow of clean air that will be supplied onto each unit and main wafer carrier 18.

Either of the wafer transfer units 16, 17 is configured to temporarily place each wafer W thereon when the wafer W is transferred between the wafer transfer portion 5 and the processing portion 2. As shown in FIG. 2, the two wafer transfer units 16, 17 are arranged on upper and lower two stages. In this construction, the wafer transfer unit 17 on the lower stage may be used for placing thereon each wafer W that is carried from the in-out portion 4 to the processing portion 2, while the wafer transfer unit 16 on the upper stage may be used for placing thereon each wafer W that is carried from the processing portion 2 to the in-out portion 4.

The main wafer carrier 18 can be moved in the X, Y and Z directions as well as can be rotated about a central axis thereof extending in the Z direction. This main wafer carrier 18 has a carrier arm 18a configured to grasp each wafer W. The carrier arm 18a is configured to be slidably moved to other portions except the main wafer carrier 18. Thus, the main wafer carrier 18 is configured to be accessible to all of the wafer transfer units 16, 17, cleaning units 12 to 15 and processing units 23a to 23f.

Each cleaning unit 12, 13, 14, 15 is configured to provide a cleaning process and a drying process to each wafer W having been subjected to the process for making the resist water-soluble. The cleaning units 12, 13, 14, 15 are respectively arranged on upper and lower two stages, two for each stage. As shown in FIG. 1, while the cleaning units 12, 13 and cleaning units 14, 15 are respectively symmetrical about a boundary wall 27, each cleaning unit 12, 13, 14, 15 can be considered to have substantially the same construction, except such symmetrical arrangement.

On the other hand, each processing unit 23a to 23f performs the process for making the resist coated on the surface of each wafer W water-soluble. As shown in FIG. 2, the processing units 23a to 23f are respectively arranged on three stages, two for each stage, in the vertical direction. On the left three stages, the processing units 23a, 23c, 23e are arranged, in this order, from the top stage, while, on the right three stages, the processing units 23b, 23d, 23f are arranged, in this order, from the top stage. As shown in FIG. 1, while the processing units 23a and 23b, processing units 23c and 23d, and processing units 23e and 23f are respectively symmetrical about a boundary wall 28, each processing unit 23a to 23f can be considered to have substantially the same construction, except such symmetrical arrangement.

Either of piping systems, for supplying the ozone gas and water vapor, as the processing fluid, to each processing unit 23a to 23f, has similar construction. Therefore, the piping system and structure of the processing unit 23a will be described in detail by way of example.

FIG. 3 is a schematic diagram of the processing unit 23a. The processing unit 23a includes a processing vessel 30 configured to store the wafer W therein. The processing vessel 30 is configured such that the ozone gas as the first processing fluid and water vapor as the second processing fluid can be supplied into the vessel 30 after such fluids are mixed in a processing-side confluence fluid passage 49 which will be described specifically later. As described above, the ozone gas and water vapor are respectively generated in and fed from the ozone gas generating unit 40 and water vapor generating unit 41 respectively provided in the processing fluid generating unit 24.

The ozone gas generating unit 40 is configured such that an oxygen-containing gas can be supplied into this portion 40. In this ozone gas generating unit 40, the ozone gas can be generated with an electrical discharge in the oxygen-containing gas. The ozone gas generating unit 40 is commonly communicated with the six processing units 23a to 23f provided in the processing system 1 and capable of supplying the ozone gas to each processing unit 23a to 23f under a predetermined pressure (e.g., 100 to 300 kPa). From an ozone source fluid passage 45 directly connected with the ozone gas generating unit 40, ozone main fluid passages 46 are respectively branched to be connected with each processing unit 23a to 23f. To each ozone main fluid passage 46, a needle valve 47 and a flow-rate meter 48 are provided. With such construction, the ozone gas generated in the ozone gas generating unit 40 can be supplied into the processing vessel 30 of the processing unit 23a at a desired flow rate.

A downstream end of the ozone main fluid passage 46 is connected with a processing-side ozone gas fluid passage 51 configured for supplying the ozone gas into the processing vessel 30 as well as connected with a bypass-side ozone gas fluid passage 52 configured for providing a bypass for allowing the ozone gas to be flowed not through the processing vessel 30, via a switch valve (or first switch valve) 50. The switch valve 50 is a three way valve configured to switch a state in which the ozone gas generated in the ozone gas generating unit 40 is supplied into the processing vessel 30 of the processing unit 23a via the processing-side ozone gas fluid passage 51 and a state in which such ozone gas is flowed through the bypass-side ozone gas fluid passage 52 without being supplied into the processing vessel 30. A downstream end of the processing-side ozone gas fluid passage 51 is connected with the processing vessel 30 via the processing-side confluence fluid passage 49, such that the ozone gas flowed through the processing-side ozone gas fluid passage 51 can be mixed with the water vapor flowed through a processing-side water vapor fluid passage 71, which will be described specifically later, in the processing-side confluence fluid passage 49. As such the mixed fluid of the ozone gas and water vapor can be supplied into the processing vessel 30. In the middle of the processing-side ozone gas fluid passage 51, a heater 51' configured to preheat the ozone gas is mounted on the fluid passage 51. This can prevent water condensation of the water vapor when the water vapor is mixed with the ozone gas in the processing-side confluence fluid passage 49. A downstream end of the bypass-side ozone gas fluid passage 52 is connected with a main discharge fluid passage 95, which will be described specifically later, via a back-flow-check orifice 53 for preventing back flow of the ozone gas.

The water vapor generating unit 41 is configured to generate the water vapor by boiling pure water supplied from the exterior. The water vapor generating unit 41 is commonly communicated with the six processing units 23a to 23f provided in the processing system 1. From a water vapor source fluid passage 55 directly connected with the water vapor generating unit 41, water vapor fluid passages 56 are branched to be connected with the processing units 23a to 23f, respectively.

To the water vapor source fluid passage 55, an escape fluid passage 59 including a pressure switch 57 and a relief valve 58 is connected, so that part of the water vapor can be evacuated from the escape fluid passage 59 to the exterior when the pressure in the water vapor generating unit 41 exceeds a preset pressure value. Consequently, the interior of the water vapor source fluid passage 55 can be always kept at a constant water vapor pressure (e.g., 80 to 95 kPa). In addition, one or more piping heaters 60 are mounted on the water vapor source fluid passage 55 so that the water vapor source fluid passage 55 can be kept at a temperature within a range of, for example, 110 to 120° C. In this way, temperature lowering of the water vapor in the water vapor source fluid passage 55 can be prevented.

The water vapor main fluid passage 56 branched from the water vapor source fluid passage 55 includes an orifice 65 and a needle valve 66. The orifice 65 and needle valve 66 serve together as a flow-rate control mechanism configured to supply the water vapor generated in the water vapor generating unit 41 into the processing vessel 30 of the processing unit 23a at a desired flow rate.

A downstream end of the water vapor main passage 56 is connected with the processing-side water vapor fluid passage 71 for supplying the water vapor into the processing vessel 30 as well as connected with a bypass-side water vapor fluid passage 72 for providing a bypass and allowing the water vapor to be flowed not through the processing vessel 30, via a switch valve (or second switch valve) 70. The switch valve 70 is a three way valve configured to switch a state in which the water vapor generated in the water vapor generating unit 41 is supplied into the processing vessel 30 of the processing unit 23a via the processing-side water vapor fluid passage 71 and a state in which such water vapor is flowed through the bypass-side water vapor fluid passage 72 without being supplied into the processing vessel 30.

A downstream end of the processing-side water vapor fluid passage 71 is connected with the processing vessel 30 via the processing-side confluence fluid passage 49, such that the ozone gas flowed through the aforementioned processing-side ozone gas fluid passage 51 can be mixed with the water vapor in the processing-side confluence fluid passage 49. Then, the so-produced mixed fluid of the ozone gas and water vapor can be supplied into the processing vessel 30. A downstream end of the bypass-side water vapor fluid passage 72 is connected with the main discharge fluid passage 95, which will be described specifically later, via a back-flow-check orifice 73 configured for preventing back flow of the water vapor. In the middle of the bypass-side water vapor fluid passage 72, a heater 72' for heating the water vapor is mounted on the fluid passage 72. This can prevent water condensation of the water vapor in a period during which the water vapor is flowed through the bypass-side water vapor fluid passage 72.

Figure 4:
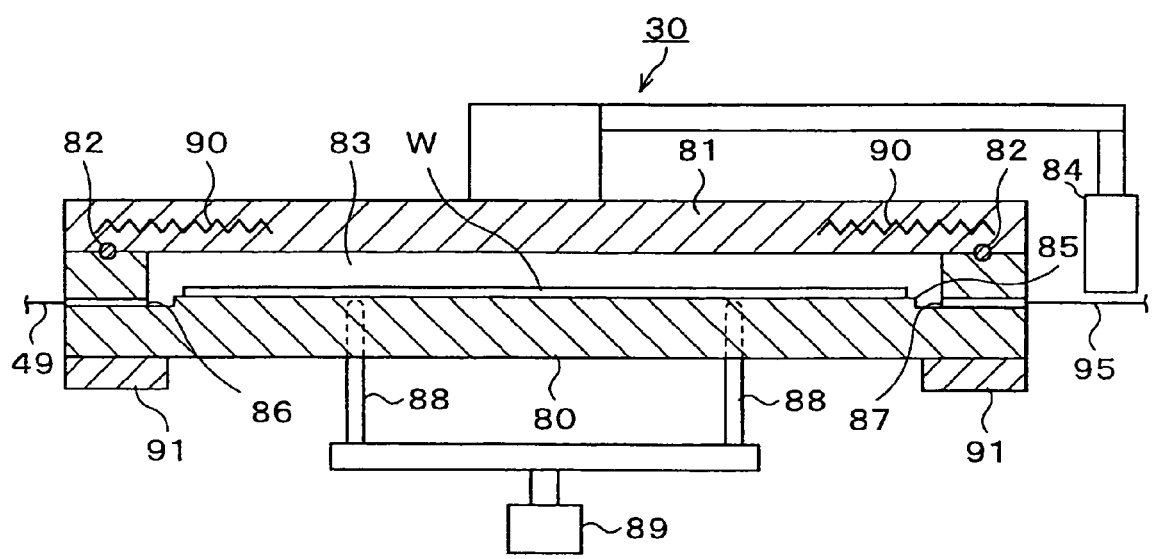
FIG. 4 is a longitudinal section view schematically showing one processing vessel which can be incorporated in the processing unit shown in FIG. 3.

FIG. 4 is a longitudinal cross section schematically showing the processing vessel 30. The processing vessel 30 includes a vessel body 80 having a hollow cylindrical shape, which is opened at its top face while closed at its bottom face, and a cover 81 having a disk-like shape that can close the opening in the top face of the vessel body 80 in an air-tight manner. Either of the vessel body 80 and cover 81 can be formed from, for example, aluminum or the like material. On the top face of a side wall of the vessel body 80, an O-ring 82, as a sealing member, is provided. As shown in FIG. 4, in a state in which the cover 81 is in close contact with the top face of the vessel body 80, a peripheral bottom face of the cover 81 is closely contacted with the O-ring 82. As a result, an airtightly sealed processing space 83 can be formed in the processing vessel 30. To a top face of the cover 81, a cylinder apparatus 84, which can optionally raise and lower the cover 81 relative to the vessel body 80, is connected. Namely, by actuating this cylinder apparatus 84, the cover 81 can be brought into close contact with the top face of the vessel body 80, thereby airtightly sealing the processing vessel 30. Contrary, by elevating the cover 81 with actuation of the cylinder apparatus 84, the cover 81 can be separated from the top face of the vessel body 80. In this case, the processing space 83 is opened, so that the wafer W can be carried in or carried out relative to the interior of the processing vessel 30.

A wafer table 85 is provided on a top face of a bottom plate of the vessel body 80. The wafer table 85 is configured such that the wafer W stored in the processing vessel 30 is placed thereon. On both sides of the table 85, a gas supply port 86 for supplying the ozone gas and water vapor as the processing fluid into the processing vessel 30 and an exhaust port 87 for discharging the ozone gas and water vapor as the processing fluid from the processing vessel 30 are opened, respectively. As will be described specifically later, an $N_2$ gas that is used as a purging gas can also be supplied into the processing vessel 30 through the gas supply port 86 and discharged from the processing vessel 30 through the exhaust port 87. In the table 85, lift pins 88, each configured to raise and lower the wafer W placed on the table 85, are incorporated. Each lift pin 88 is configured to be moved in the vertical direction by means of actuation of a cylinder apparatus 89 located below the vessel body 80.

A ring-shaped heater 90 is incorporated in the cover 81. In addition, a ring-shaped heater 91 is attached to a surface of a bottom face of the vessel body 80. By means of heating due to these heaters 90 and 91, the temperature of the entire processing vessel 30 can be controlled, so that the processing space 83 can be kept at a desired process temperature.

The gas supply port 86 is in communication with the processing-side confluence fluid passage 49. As described above, the mixed processing fluid of the ozone gas and water vapor mixed in the processing-side confluence fluid passage 49 is supplied into the processing vessel 30 through the gas supply port 86. On the other hand, the exhaust port 87 for discharging the ozone gas and water vapor (or mixed processing fluid) as the processing fluid from the processing vessel 30 is in communication with the main discharge fluid passage 95. As shown in FIG. 3, a switch valve 96, a pressure switch 97, a back-flow-check orifice 98, an air operation valve 99, and a relief valve 100 as a pressure control mechanism are provided, in this order, to the main discharge fluid passage 95. Additionally, in the main discharge fluid passage 95, a downstream end of the bypass-side ozone gas fluid passage 52 and a downstream end of the bypass-side water vapor fluid passage 72 are respectively connected with a portion extending between the back-flow-check orifice 98 and the air operation valve 99. In other words, the downstream end of the bypass-side ozone gas fluid passage 52 and the downstream end of the bypass-side water vapor fluid passage 72 are respectively connected with the main discharge fluid passage 95 upstream from the relief valve (or pressure control mechanism) 100.

In this embodiment, an $N_2$ gas supply fluid passage 105 for supplying the $N_2$ gas, i.e., an inert gas used as the purging gas, is connected with a middle portion of the processing-side ozone gas fluid passage 51. This $N_2$ gas supply fluid passage 105 is branched from an $N_2$ gas source fluid passage 106 extending outside the processing system 1. The $N_2$ gas source fluid passage 106 is in turn connected with an $N_2$ gas supply source located outside the processing system 1, and is configured to be supplied with the $N_2$ gas from this $N_2$ gas supply source. In the $N_2$ gas supply fluid passage 105, an air operation valve 107 configured for controlling the supply of the $N_2$ gas is provided. In this case, a downstream end of the $N_2$ gas supply fluid passage 105 is connected with the processing-side ozone gas fluid passage 51 downstream from the switch valve 50.

To the switch valve 96 provided to the main discharge fluid passage 95, an $N_2$ gas discharge fluid passage 108 for discharging the $N_2$ gas that is the inert gas used as the purging gas is connected. An upstream end of this $N_2$ gas discharge fluid passage 108 is connected with the main discharge fluid passage 95, via the switch valve 96, upstream from both of the connection point of the downstream end of the bypass-side ozone gas fluid passage 52 and the connection point of the downstream end of the bypass-side water vapor fluid passage 72. The switch valve 96 is a three way valve configured to switch a state in which the ozone gas and water vapor, as the processing fluid, discharged from the processing vessel 30 through the exhaust port 87 are evacuated through the main discharge fluid passage 95, as will be described below, and a state in which the $N_2$ gas, as the purging gas, discharged from the processing vessel 30 through the exhaust port 87 is evacuated through the $N_2$ gas discharge fluid passage 108, as will be described below.

Each functional element of the processing system 1 is connected with the control unit 19 configured to automatically control the entire operation of functional elements included in the processing system 1, via each signal line. For instance, the functional elements include the wafer carrier 7 and window opening and closing mechanism 10 provided in the transfer portion 3, main wafer carrier 18 and four cleaning units 12, 13, 14, 15 provided in the processing portion 2, ozone gas generating unit 40 and water vapor generating unit 41 provided in the processing fluid generating unit 24, chemical liquid storage unit 25, and all of other functional elements, each adapted for achieving a desired process condition, such as switching valves 50, 70, 96 and the like incorporated in each processing unit 23a to 23f. The control unit 19 is typically composed of a general-purpose computer which can provide any given function, depending on software to be executed.

As shown in FIG. 1, the control unit 19 includes a calculation portion 19a including a CPU (Central Processing Unit), an input-output portion 19b connected with the calculation portion 19a, and a storage medium 19c connected with the input-output portion 19b and storing control software therein. The storage medium 19c stores therein such control software (or program) that is executed by the control unit 19 so as to drive the processing system 1 to provide a predetermined process to a substrate, as described below. More specifically, the control unit 19 executes the software program in order to control each functional element of the processing system 1 such that various process conditions respectively set in a predetermined process recipe (e.g., the temperature of the processing vessel 30 and the like) can be achieved.

The storage medium 19c may be fixedly attached to the control unit 19, or otherwise may be detachably provided to a reader (not shown) incorporated in the control unit 19 such that the storage medium 19c can be read by the reader as needed. In one example of the most typical embodiment, the storage medium 19c is a hard disk drive in which the control software is installed by a serviceman of a maker of the processing system 1. In an alternative embodiment, the storage medium 19c may be a removable disk, such as a CD-ROM or DVD-ROM, in which the control software is written or stored. Such a removable disk can be read by an optical reader (not shown) provided in the control unit 19. Alternatively, the storage medium 19c may be either of a RAM (random access memory) or ROM (read only memory). Furthermore, the storage medium 19c may be a cassette-type ROM. In short, any suitable memory commonly used in the technical field of the computer can be used as the storage medium 19c. In a factory in which a plurality of processing systems 1 are installed, the control software may be stored in a main control computer for collectively control the control units 19 of the respective processing systems 1. In this case, each processing system 1 is operated by the main control computer, via each communication circuit, so as to perform a predetermined process.

Next, the processing step for each wafer W in the processing system 1 constructed as described above will be discussed. First, the wafers W are taken out, one by one, from each carrier C placed on the table 6 of the in-out port 4, by the take-out-and-storage arm 11. Subsequently, each wafer W taken out by the take-out-and-storage arm 11 is carried to the transfer unit 17 located on the lower stage of the processing unit 2. Thereafter, the wafer W carried to the transfer unit 17 is transferred into a suitable one of the processing units 23a to 23f, by the main wafer carrier 18. In each processing unit 23a to 23f, the resist coated on the surface of the wafer W is made water-soluble. Then, the wafer W having been subjected to a predetermined process for making it water-soluble is carried out from the suitable one of the processing units 23a to 23f, by the carrier arm 18a of the main wafer carrier 18. Thereafter, the wafer W is suitably carried into each cleaning unit 12, 13, 14, 15, by the carrier arm 18a of the main wafer carrier 18, and a cleaning process for removing the resist, which remains on the wafer W and has been made water-soluble, with pure water or the like, is provided to the wafer W. In this manner, the resist coated on the wafer W is peeled off. After providing the cleaning process to the wafer W, each cleaning unit 12, 13, 14, 15 may further provide a particle-and-metal-removing process to the wafer W, by using a chemical liquid, and then dry it, as needed. Subsequently, the wafer W is carried to the transfer unit 16 located on the upper stage, by the carrier arm 18a. Then, the wafer carried into the transfer unit 16 is received by the take-out-and-storage arm 11, and is carried into the carrier C by this take-out-and-storage arm 11. In this way, the wafers from which the resist has been peeled off are contained in the carrier C, one after another.

In regard to an operational mode of each processing unit 23a to 23f, the operation of the processing unit 23a will be described in detail by way of one example. First of all, in the processing vessel 30, the cover 81 is elevated by means of the actuation of the cylinder apparatus 84, so that the cover 81 can be separated from the top face of the vessel body 80. As a result, the processing space 83 having been formed in the vessel body 80 is opened. In this state, the wafer W is carried into the vessel body 80 by the carrier arm 18a of the main wafer carrier 18, and placed on the wafer table 85. Upon placing the wafer W on the table 85, the lift pins 88 provided in the table 85 first receive the wafer W thereon, while respectively taking a position elevated by means of the actuation of the cylinder apparatus 89. Thereafter, the lift pins 88 are respectively lowered, so that the wafer W can be placed on the table 85. Subsequently, the carrier arm 18a is retracted from the opened processing space 83, and then the cover 81 is lowered to form the processing space 83 which is sealed in an air-tight manner.

After the wafer W is carried into the processing space 83, as described above, a temperature rising step is first performed in order to elevate the temperature of the processing vessel 30 and wafer W. In this temperature rising step, the temperature of the processing vessel 30 and wafer W is elevated by the heaters 90, 91. Simultaneously, the ozone gas produced by the ozone gas generating unit 40 is supplied into the processing vessel 30 of the processing unit 23a, from the processing-side ozone gas fluid passage 51, via the processing-side confluence fluid passage 49, due to a switching operation by the switch valve 50. On the other hand, the water vapor produced by the water vapor generating unit 41 is fed into the bypass-side water vapor fluid passage 72, due to a switching operation by the switch valve 70, and hence discharged into the main discharge fluid passage 95, without passing though the processing vessel 30. Additionally, in this temperature rising step, the air operation valve 107 provided to the $N_2$ gas supply fluid passage 105 is closed, and thus the supply of the $N_2$ gas into the processing vessel 30 is stopped. Furthermore, the ozone gas discharged from the processing vessel 30 via the exhaust port 87 will be discharged (evacuated) through the main discharge fluid passage 95, due to a switching operation of the discharge fluid passage by the switch valve 96 provided to the main discharge fluid passage 95.

It is noted that the ozone gas generated by the electrical discharge in the oxygen-containing gas in the ozone gas generating unit 40 is supplied from the ozone gas generating unit 40, at a set pressure of, for example, 100 to 300 kPa. In this case, the flow rate of the ozone gas is set at, for example, 2 to 5 litters/min, by the needle valve 47 provided to the ozone main fluid passage 46.

On the other hand, the water vapor generated by boiling pure water in the water vapor generating unit 41 is supplied from the water vapor generating unit 41 at a set pressure of, for example, 80 to 95 kPa. In this case, the flow rate of the water vapor is set at, for example, 2 to 5 g/min, by the needle valve 66 provided to the water vapor main fluid passage 56.

In this manner, in the temperature rising step, the temperature of the processing vessel 30 and wafer W is elevated up to a predetermined temperature, while the interior atmosphere of the processing vessel 83 is substituted with an ozone atmosphere. In this case, the predetermined temperature to which the temperature of the processing vessel 30 and wafer W is elevated is within a range of, for example, 100 to 110° C.

In this temperature rising step, the ozone gas discharged from the processing vessel 30 through the exhaust port 87 is discharged (evacuated) through the main discharge fluid passage 95. Additionally, the water vapor fed through the bypass-side water vapor fluid passage 72 is discharged into the main discharge fluid passage 95 after flowed around the processing vessel 30. In this manner, a mixed gas of the ozone gas and water vapor is discharged (evacuated) to the outside from the main discharge fluid passage 95, via the air operation valve 99 and relief valve 100. A set pressure of the relief valve 100 provided to the main discharge fluid passage 95 is set within a range of, for example, 50 to 75 kPa.

Next, the processing step for processing the wafer W stored in the processing vessel 30 is performed. In this step, the water vapor produced by the water vapor generating unit 41 is supplied into the processing vessel 30 of the processing unit 23a, from the processing-side water vapor fluid passage 71, via the processing-side confluence fluid passage 49, due to the switching operation of the switch valve 70.

In this case, in the processing-side confluence fluid passage 49, the ozone gas fed from the processing-side ozone gas fluid passage 51 and preheated by the heater 51' is mixed with the water vapor supplied from the processing-side water vapor fluid passage 71. In this way, the mixed gas produced by mixing the ozone gas and water vapor in the processing-side confluence fluid passage 49 is supplied into the processing vessel 30 through the gas supply port 86.

Thus, in this processing step, the mixed gas of the ozone gas and water vapor can be supplied to the wafer W, at a constant temperature, in the processing vessel 30 in which the temperature has been elevated up to a predetermined temperature. In this way, the resist coated on the surface of the wafer W can be securely oxidized, thereby performing the process for making this resist water-soluble more efficiently and stably.

In this processing step, the mixed gas of the ozone gas and water vapor discharged from the processing vessel 30 through the exhaust port 87 is discharged (evacuated) through the main discharge fluid passage 95. Also in this processing step, the set pressure of the relief valve 100 provided to the main discharge fluid passage 95 is set within a range of, for example, 50 to 75 kPa, as with the above temperature rising step. By means of flow rate control due to this relief valve 100, the flow rate and process pressure of the mixed gas of the ozone gas and water vapor supplied into the processing vessel 30 can be stabilized, thereby to perform the process for making the resist water-soluble under a relatively constant condition.

After such a predetermined process for making the resist water-soluble has been ended, a purging step for replacing the atmosphere in the processing vessel 30 with the $N_2$ gas is performed. In this purging step, the ozone gas generated in the ozone gas generating unit 40 is no longer supplied into the processing vessel 30, but fed into the main discharge fluid passage 95 through the bypass-side ozone gas fluid passage 52, due to the switching operation by the switch valve 50. Similarly, the water vapor generated in the water vapor generating unit 41 is no longer supplied into the processing vessel 30, but fed into the main discharge fluid passage 95 via the bypass-side water vapor fluid passage 72, due to the switching operation by the switch valve 70.

Additionally, in this purging step, the air operation valve 107 provided to the $N_2$ gas supply fluid passage 105 is opened, and the $N_2$ gas is supplied into the processing vessel 30 through the processing-side ozone gas fluid passage 51. Furthermore, due to the switching operation of the discharge route by the switch valve 96 provided to the main discharge fluid passage 95, the $N_2$ gas discharged from the processing vessel 30 via the exhaust port 87 is fed into the $N_2$ gas discharge fluid passage 108. In this way, the $N_2$ gas discharged from the processing vessel 30 will be no longer flowed into the relief valve 100 provided to the $N_2$ gas supply fluid passage 105. Accordingly, in this purging step, the $N_2$ gas is supplied into the processing vessel 30, and thus the atmosphere in the processing vessel 30 can be replaced with the $N_2$ gas.

In this purging step, the ozone gas fed through the bypass-side ozone gas fluid passage 52 and the water vapor fed through the bypass-side water vapor fluid passage 72 are flowed together in the main discharge fluid passage 95 and then discharged (evacuated) to the outside from the main discharge fluid passage 95 through the air operation valve 99 and relief valve 100. Also in this purging step, the set pressure of the relief valve 100 provided to the main discharge fluid passage 95 is set within a range of, for example, 50 to 75 kPa, which is the same as the temperature rising step and processing step described above.

Once the atmosphere in the processing vessel 30 is replaced with the $N_2$ gas by the purging step, the wafer W is taken out from the processing vessel 30. More specifically, the cover 81 is first elevated by means of the actuation of the cylinder apparatus 84, so that the cover 81 can be separated from the top face of the vessel body 80. As a result, the processing vessel 83 containing the wafer W can be opened. In this state, the lift pins 88 are elevated by means of the actuation of the cylinder apparatus 89, so that the wafer W can be raised from the table 85. Subsequently, the carrier arm 18a of the main wafer carrier 18 is moved to a suitable position below the wafer W, and the wafer W is received on the carrier arm 18a from the lift pins 88. Thereafter, the wafer W is carried out from the processing vessel 30 by the main wafer carrier 18.

According to this embodiment described above, in either of the above temperature rising step, processing step and purging step, the ozone gas generated in the ozone gas generating unit 40 and the water vapor generated in the water vapor generating unit 41 can be discharged to the outside from the main discharge fluid passage 95 through the air operation valve 99 and relief valve 100. Therefore, regardless of any step performed, the flow rate of the gas flowed through the relief valve 100 that is the pressure control mechanism can be made substantially constant, thereby maintaining the operation of the pressure control mechanism in a significantly stabilized state. Consequently, the production of the processing fluid can be stabilized, and therefore desired uniformity of the process provided to the wafer W in the processing vessel 30 can be ensured. In addition, since the pressure control mechanism can be maintained in a stabilized state, even in the step other than the processing step, the ozone gas and water vapor constituting together the processing fluid can be generated in the ozone gas generating unit 40 and water vapor generating unit 41, respectively, under the same condition as in the processing step, without causing any pressure fluctuation. As such, the uniformity of the process provided to the wafer W can be securely enhanced.

As demonstrated in the above embodiment, even in the case in which the processing fluid is supplied, from the common ozone gas generating unit 40 and water vapor generating unit 41, to the plurality of (e.g., six) processing units 23a to 23f, the pressure and flow rate of the processing fluid supplied to each processing vessel 30 can be significantly stabilized. Therefore, even in the case in which the processing fluid is supplied to the plurality of processing vessels from the common processing fluid generating units, negative interference between the processing vessels 30 of the processing units 23a to 23f can be avoided. Thus, each wafer W can be processed under the same condition in each processing vessel 30 of the plurality of processing units 23a to 23f. Consequently, uniformity and reliability in peeling of the resist that will be performed later in the cleaning process of each cleaning unit 12, 13, 14, 15 and uniformity and reliability of the entire etching process including each process performed in the processing system 1 can be significantly enhanced.

While one preferred example of the embodiment of this invention has been shown and described, the present invention is not limited to this aspect. For instance, while the relief valve 100 has been described, by way of example, as the pressure control mechanism provided to the main discharge fluid passage 95, another suitable mechanism that can adequately control the pressure and flow rate of the fluid may also be used. Furthermore, in addition to or in place of the ozone gas and water vapor, the processing fluid applicable to this invention may include any other suitable processing gases. Namely, this invention can be widely applied to any process using various processing fluids. Additionally, the object to be processed is not limited to the semiconductor wafer, but may include any other suitable substrate, such as a glass substrate used for producing LCDs, CD substrate, printed circuit board, ceramic substrate or the like.

It should be noted that the present invention can be applied to the cleaning process for any suitable substrate, such as the semiconductor wafer, glass for the LCD substrate or the like.

The invention claimed is:

1. A processing system comprising:
   a processing vessel configured to contain an object to be processed;
   a processing fluid generating unit configured to generate a processing fluid;
   a processing-side fluid passage configured for supplying the processing fluid generated in the processing fluid generating unit into the processing vessel;
   a discharge fluid passage configured for discharging the processing fluid from the processing vessel;
   a bypass-side fluid passage connected with the discharge fluid passage at its downstream end and connected with the processing-side fluid passage at its upstream end, and configured for discharging the processing fluid generated in the processing fluid generating unit without passing said processing fluid through the processing vessel;
   a pressure control mechanism provided to the discharge fluid passage downstream from a position at which the downstream end of the bypass-side fluid passage is connected with the discharge fluid passage;
   a switch valve configured to selectively switch a fluid passage, into which the processing fluid generated in the processing fluid generating unit is fed, between the processing-side fluid passage and the bypass-side fluid passage;
   a purging gas supply fluid passage configured for supplying a purging gas into the processing vessel, a downstream end of the purging gas supply fluid passage being connected with the processing-side fluid passage downstream from the switch valve;
   a purging gas discharge fluid passage configured for discharging the purging gas from the processing vessel, an upstream end of the purging gas discharge fluid passage being connected with the discharge fluid passage upstream from the position at which the downstream end of the bypass-side fluid passage is connected with the discharge fluid passage;

an on-off valve provided to the purging gas supply fluid passage and configured for controlling a supply of the purging gas; and a discharge switch valve provided at a position at which the purging gas discharge fluid passage is connected to the discharge fluid passage, and configured to make the processing fluid flow in the discharge fluid passage through the discharge switch valve and to make the purging gas flow from the discharge fluid passage into the purging gas discharge fluid passage, wherein the on-off valve, the switch valve, and the discharge switch valve are controlled such that:

when the purging gas flows into the processing vessel from the purging gas supply fluid passage through the on-off valve, the processing fluid generated in the processing fluid generating unit is fed into the bypass-side fluid passage through the switch valve and then discharged from the discharge fluid passage after passing through the pressure control mechanism, while the purging gas discharged from the processing vessel is fed into the purging gas discharge fluid passage through the discharge switch valve and then exhausted from the purging gas discharge fluid passage; and when the processing fluid generated in the processing fluid generating unit flows into the processing vessel and the object to be processed is processed, the processing fluid fed into the processing vessel is discharged from the discharge fluid passage after passing through the pressure control mechanism, while the purging gas is prevented from flowing into the processing vessel by the on-off valve;

when the purging gas flows into the processing vessel from the purging gas supply fluid passage through the on-off valve, the purging gas discharged from the processing vessel and fed into the purging gas discharge fluid passage through the discharge switch valve is prevented from flowing through the pressure control mechanism.

2. The processing system according to claim 1, wherein the purging gas is an inert gas.

3. The processing system according to claim 1, wherein the processing fluid is an ozone gas.

4. The processing system according to claim 1, further comprising:

a second processing fluid generating unit configured to generate a second processing fluid different from the processing fluid;

a second processing-side fluid passage configured for supplying the second processing fluid generated in the second processing fluid generating unit into the processing vessel;

a second bypass-side fluid passage configured for discharging the second processing fluid generated in the second processing fluid generating unit without passing said second processing fluid through the processing vessel; and a second switch valve configured to selectively switch a fluid passage, into which the second processing fluid generated in the second processing fluid generating unit is fed, between the second processing-side fluid passage and the second bypass-side fluid passage, wherein a downstream end of the second bypass-side fluid passage is connected with the discharge fluid passage upstream from the pressure control mechanism.

5. The processing system according to claim 4, wherein the second processing fluid is water vapor.

6. The processing system according to claim 1, wherein the processing vessel includes a plurality of processing vessels, wherein the processing-side fluid passage includes a plurality of processing-side fluid passages, each processing-side fluid passage being provided separately, for each processing vessel, wherein the discharge fluid passage includes a plurality of discharge fluid passages, each discharge fluid passage being provided separately, for each processing vessel, wherein the bypass-side fluid passage includes a plurality of bypass-side fluid passages, each bypass-side fluid passage being provided separately, for each processing vessel, wherein the pressure control mechanism includes a plurality of pressure control mechanisms, each pressure control mechanism being provided individually, for each discharge fluid passage, wherein a downstream end of each bypass-side fluid passage is connected with each corresponding discharge fluid passage upstream from each corresponding pressure control mechanism, and wherein the processing fluid generated in the processing fluid generating unit is selectively fed into each corresponding processing-side fluid passage and each corresponding bypass-side fluid passage.

7. The processing system according to claim 1, wherein when the purging gas flows into the processing vessel from the purging gas supply fluid passage through the on-off valve, the processing fluid generated in the processing fluid generating unit and fed into the bypass-side fluid passage through the switch valve is then exhausted from the discharge fluid passage after passing through the pressure control mechanism; and when the processing fluid generated in the processing fluid generating unit flows into the processing vessel and the object to be processed is processed, the processing fluid fed into the processing vessel is exhausted from the discharge fluid passage after passing through the pressure control mechanism.

* * * * *